United States Patent [19]
Ovshinsky et al.

[11] Patent Number: 5,166,758
[45] Date of Patent: Nov. 24, 1992

[54] ELECTRICALLY ERASABLE PHASE CHANGE MEMORY

[75] Inventors: Stanford R. Ovshinsky, Bloomfield Hills; Stephen J. Hudgens, Southfield; Wolodymyr Czubatyj, Warren; David A. Strand, West Bloomfield; Guy C. Wicker, Southfield, all of Mich.

[73] Assignee: Energy Conversion Devices, Inc., Troy, Mich.

[21] Appl. No.: 642,984

[22] Filed: Jan. 18, 1991

[51] Int. Cl.[5] .............................................. H01L 45/00
[52] U.S. Cl. ......................................... 257/3; 365/163; 257/4; 257/5
[58] Field of Search ............................. 357/2; 365/163

[56] References Cited
U.S. PATENT DOCUMENTS

| | | | |
|---|---|---|---|
| 3,271,591 | 9/1966 | Ovshinsky | 357/2 |
| 3,699,543 | 10/1972 | Neale | 357/2 |
| 3,918,032 | 11/1975 | Nicolaides | 357/2 |
| 4,177,475 | 12/1979 | Holmberg | 357/2 |
| 4,203,123 | 5/1980 | Shanks | 357/2 |
| 4,845,533 | 7/1989 | Pryor | 357/2 |

Primary Examiner—William D. Larkins
Attorney, Agent, or Firm—Lawrence G. Norris

[57] ABSTRACT

An electrically erasable phase change memory utilizing a stoichiometrically and volumetrically balanced phase change material in which both the switching times and the switching energies required for the transitions between the amorphous and the crystalline states are substantially reduced below those attainable with prior art electrically erasable phase change memories. One embodiment of the invention comprises an integrated circuit implementation of the memory in a high bit density configuration in which manufacturing costs are correspondingly reduced and performance parameters are further improved.

28 Claims, 7 Drawing Sheets

ELECTRICALLY ERASABLE PHASE CHANGE MEMORY

The present invention relates to electrically erasable phase change memories.

BACKGROUND AND PRIOR ART

The general concept of utilizing electrically erasable phase change materials (i.e., materials which can be electrically switched between generally amorphous and generally crystalline states) for electronic memory applications is well known in the art and is disclosed, for example, in U.S. Pat. No. 3,271,591—Ovshinsky, issued Sep. 6, 1966 and in U.S. Pat. No. 3,530,441—Ovshinsky, issued Sep. 22, 1970, both assigned to the same assignee as the present invention.

As disclosed in the aforementioned Ovshinsky patents, such phase change materials can be electrically switched between two different structural states of generally amorphous and generally crystalline local order or between different detectable states of local order across the complete spectrum between the completely amorphous and completely crystalline states. That is, the switching of such materials is not required to take place between completely amorphous and completely crystalline states but rather can be in incremental steps of local order changes to provide a "gray scale" represented by a multiplicity of conditions of local order across the spectrum between completely amorphous and completely crystalline states. The materials described can also be switched between only two structural states of generally amorphous and generally crystalline local order to accommodate storage and retrieval of digital information.

The Ovshinsky electrically erasable phase change memories were fully adequate for many applications at the time they were originally introduced and were utilized in a number of applications. However, because further development of that early technology was not possible because of lack of the necessary resources to carry the same forward, subsequent developments in other fields of solid state, electronic memories and in other types of memories in general, such as those utilizing magnetic and optical media, gradually displaced that early electrically erasable phase change technology.

As a result of the aforementioned lack of ongoing development support, there are at the present time several limitations in the electrically erasable memory applications of the Ovshinsky phase change materials which have prevented their widespread use in electrically erasable phase change memories. One of these has been the relatively slow (by present standards) electrical switching speed which such prior art materials have exhibited, particularly in the direction of greater local order or in the direction of increasing crystallization. Another has been the relatively high energy required for initiating the phase change between one state and the other.

For example, the switching times of such prior art phase change materials are typically in the range of a few milliseconds for the set time from the amorphous state to the crystalline state and perhaps a microsecond or so reset time from the crystalline state back to amorphous state. The electrical energy required to switch such prior art materials was typically measured in the range of about a microjoule.

The concept of utilizing the Ovshinsky phase change materials in non-erasable or non-reversible, write-once electrically programmable memories is also well known in the prior art. This type of electrically programmable phase change memory is disclosed, for example, in U.S. Pat. Nos. 4,499,557—Holmberg et al., issued Feb. 12, 1985 and 4,599,705—Holmberg et al., issued Jul. 8, 1986, and assigned to the same assignee as the present invention. The aforementioned Holmberg et al. patents include tetrahedrally chemically bonded materials such as carbon, silicon and germanium and alloys thereof as phase change materials which are utilized in a non-reversible or non-resettable mode. Such materials are disclosed as having, for example, characteristics which require threshold setting voltages of up to 10 volts, currents up to 25 milliamps and setting times of up to 100 microseconds. Thus, the set energy required is up to 250 milliwatts with set times up to 100 microseconds.

Accordingly, because of the lack of ongoing development support, these materials have not found widespread use in reversible or electrically erasable memory applications, where other types of memories offer substantially lower switching times and energies. Instead, other forms of solid state, electronic memories have evolved and have enjoyed some limited use in these applications. These memories typically use several solid state microelectronic circuit elements for each memory bit, as many as three or four transistors per bit, for example, in some memory applications. The primary memory elements in such solid state memories are typically floating gate field effect transistor devices which hold a charge on the field effect transistor gate to store a memory bit. Since this charge can leak off with the passage of time, the storage of information is thus not truly non-volatile as it is in the phase change media where information is stored through changes in the actual structure of the material.

Such solid state, electronic memories which are presently in use are also relatively expensive to manufacture and their cost is typically about twice the cost per bit of storage capacity in relation to magnetic disk storage. On the other hand, solid state, electronic memories have certain advantages over magnetic disk memories in that solid state memories have no moving parts, are easy to transport and store and are more versatile in their adaptability for use with portable computers and other portable electronic devices. In addition, such solid state memories are usually true random access systems as opposed to disk types which require physical movement of the disk head to the proper data track for accessing the desired memory location.

However, in spite of such advantages of solid state electrically erasable memories, their substantially higher costs have prevented them from enjoying a substantial share of the market now dominated by disk type memory systems. Although electrical solid state memories based on phase change materials have shown potential for manufacture at reduced costs, the performance parameters available from such systems as known in the prior art have not been adequate to permit their widespread use as replacements for disk type systems or other solid state memory systems of the type described above.

SUMMARY OF THE INVENTION

The present invention provides a new solid state, erasable, electronic memory utilizing unique phase change materials in novel and specially adapted configurations which exhibit many orders of magnitude higher switching speeds at energy levels which are remarkably reduced from those attainable in prior art systems. The new memory has stable and truly nonvolatile structural states, which can be selected between two switchable structural states of detectably different local order for application to typical digital systems, or which can be selected from a number of intermediate structural states of detectably different local order to provide a gray scale of available memory setting conditions. The magnitude of the improvement in switching times and in switching energies is truly enormous, being in the range of a number of orders of magnitude and not just incremental in nature, and is totally unexpected and beyond what was thought possible with prior art materials.

One embodiment of the invention utilizes an electrically switchable material of a composition and volumetric stoichiometry such that the elements of the material are distributed within the material in the amorphous state and are substantially fully absorbed per unit volume of the material in one or more stable crystalline phases in the crystalline state. The elements are also preferably absorbed in the one or more crystalline phases with substantially the same local atomic density of the constituent elements as present in the amorphous state. Migration of the elements within the material in the course of the switching transitions is thus minimized and both the switching times and energy levels are thereby very substantially reduced from those attainable in prior art electrically erasable phase change systems.

In another embodiment, the characteristics of the electrical switching parameters are generated relative to the material transition parameters such that optimum switching transitions are provided, thereby further enhancing performance relative to that attainable in the prior art.

In still another embodiment, a memory configuration utilizing the novel materials of the invention is set forth in which the bit density of the memory is greatly increased and enhanced over prior art configurations and in which performance parameters are further improved.

Other embodiments and features of the present invention as well as other advantages and objects thereof will be set forth and become apparent the detailed description which follows, taken in connection with the accompanying drawings.

DETAILED DESCRIPTION OF THE INVENTION

We have discovered that while prior art erasable electrical phase change memories have been based on changes in local structural order, they have also typically accommodated such structural changes by atomic movement of certain species within the material to permit phase separation as the material is switched from the amorphous state to a multi-phase crystalline state. For example, in the case of electrically switchable chalcogenide alloys formed of tellurium and germanium, such as those comprising about 80% to 85% tellurium and about 15% germanium along with certain other elements in small quantities of about one to two percent each, such as sulfur and arsenic, the more ordered or crystalline state was typically characterized by the formation of a highly electrically conductive crystalline Te filament within the switchable pore of the memory material. A typical composition of such a prior art material would be, for example, $Te_{81}Ge_{15}S_2As_2$. Another example of such a prior art material is $Te_{81}Ge_{15}S_2Sb_2$. Because Te is so highly conductive in its crystalline state, a very low resistance condition was therefore established through the crystalline Te filament which was a number of orders of magnitude lower than the resistance of the pore in the less ordered or amorphous state.

However, the formation of the conductive Te filament in the crystalline state required migration of the Te atoms from their atomic configuration in the amorphous state to the new locally concentrated atomic configuration in the crystalline Te filament state. Similarly, when the material was switched back to the amorphous state, the Te which had precipitated out into the crystalline filament was required to migrate within the material from its locally concentrated form in the filament back to its atomic configuration in the amorphous state.

We have found that this atomic migration, diffusion or re-arrangement between the amorphous and crystalline states required in each case a holding or dwell time necessary to accommodate the migration, thereby making the switching time and energy relatively high compared to other types of erasable semiconductor memories. We have now discovered certain new principles which permit a remarkable improvement in both switching time and energy for this type of electrically erasable phase change memory.

One simple form of a material which meets the selection criteria of the present invention is $Te_{52}Ge_{24}Sb_{24}$ average composition by atomic percent, which is distributed throughout the material in the amorphous state and which crystallizes into two crystalline phases of approximate compositions of $Te_{52}Ge_{18}Sb_{30}$ for one phase and $Te_{52}Ge_{30}Sb_{18}$ for the other phase which are present in about equal atomic fractions but in proportion to each other such that all of the atoms of the elements present in the amorphous state are absorbed in the two crystalline phases of the crystalline state. Thus, there are available readily formed multi-element crystalline phases which absorb or consume substantially all of the elements which are present in the amorphous state, thereby avoiding the precipitation out of the lattice of any separate elements which are not substantially fully absorbed in the readily formed major crystalline phases.

Because of the lack of any substantial atomic migration associated with the phase changes between the amorphous and crystalline structures, the phase transitions occur rapidly and with a high degree of stability of both the amorphous and crystalline states.

A further criterion of another embodiment of the present invention is that the semiconductor band gap of the material be substantially reduced in the transition from the amorphous to the crystalline state, or even that it substantially or completely collapse such that the conduction and valence bands are close to each other or overlap. If the band gap is very small in the crystalline state relative to the amorphous state, thermally generated carriers under normal operating conditions will provide good conductivity and low resistance in the crystalline state compared to the amorphous state.

Another composition which meets the criteria of the invention is $Te_{51}Ge_{40}Sb_9$, which forms a single crystalline phase of substantially the same composition as the elements in the amorphous state. Thus, the material is compositionally substantially the same in the amorphous state and in the single crystalline phase which is formed when the material is electrically switched to the crystalline state. This material exhibits a further advantage in accordance with another above-mentioned criterion of the invention in that its electronic band gap is caused to collapse in the transition from the amorphous state and the crystalline state such that it is no longer a semiconductor but rather is a metal or a semi-metal. That is, its band gap collapses and the conduction and valence bands overlap in the crystalline state, thereby providing a very high electrical conductivity and exhibiting essentially a metallic form of electrical conduction. This yields a very high ratio of resistances between the "on" and "off" or "set" and "reset" conditions.

The transition of the aforementioned material to a semi-metal state was determined by measuring the temperature dependence of the electrical conductivity of the material. In a semiconductor, electrical conductivity increases with increasing temperature. It was found that, instead, the electrical conductivity of the aforementioned material in the crystalline state actually decreased slightly with increasing temperature, thereby exhibiting the properties of a material in which the valence and conduction bands actually overlap.

Other available crystalline structural phases for these elements have been determined to be $Te_{52}Ge_{43}Sb_5$ and $Te_{20}Ge_{20}Sb_{60}$. Similar preferred crystalline structural phases can be determined for other combinations of elements in accordance with the teachings of the present invention such that the formation of the available multi-element crystalline phases substantially absorbs all of the elements present in the amorphous state.

The elements of the erasably switchable alloy are selected such that substantially all of the elements in the composition are distributed in the amorphous state and are all substantially absorbed per unit volume of the material into stable crystalline phases in the transition from the amorphous state to the crystalline state. The result is a material which can be very rapidly switched between the two states at a very low energy, that is, at switching times and energy levels far below those attainable or heretofore even thought possible with prior art erasable electrical memory materials.

The compositional stoichiometry and volumetric distribution of the constituent elements within the material is such that all of the constituent elements are substantially fully absorbed per unit volume of material in one or more crystalline phases which are formed in the crystalline state. In addition, the constituent elements are preferably absorbed in the one or more crystalline phases with substantially the same average local atomic density distribution, i.e., the same average local concentration, of the constituent elements as present in the amorphous state. Thus, the material is fully crystallized per unit volume and the local atomic density of the constituent elements is only minimally disturbed by the transitions between the amorphous and crystallines states. Atomic migration within the material during phase transitions is thus minimized and electrical switching speeds and energies are remarkably reduced by orders of magnitude below prior art electrically erasable phase change memories.

The elements of the material will usually be substantially homogeneously distributed within the material as originally deposited but may become locally somewhat concentrated in certain regions of the material to conform to the crystalline phase locations and concentrations of the atoms in the matrix. However, in the phase transition from the crystalline to the amorphous state, the material becomes molten and diffusion takes place which would tend to distribute the atoms somewhat homogeneously within the bulk of the material. Such homogeneous distribution in the amorphous state is not necessary, however, for the material to function in accordance with the invention. The elements of the phase change material are thus described herein as being distributed throughout the material in the amorphous state, but it is to be understood that such distribution may include some localized concentrations of some or all of the elements that may occur with switching back and forth between amorphous and crystalline states.

It is to be understood, of course, that the local atomic densities of the constituent elements can not be exactly the same in both the amorphous and the crystalline states. Some accommodation in the local atomic arrangement is necessary to permit the changes in structural order between the amorphous and the crystalline states. What is to be avoided, however, in applying the principles of the present invention, is what is now understood to be the gross distortion in local atomic density which was characteristic of prior art electrically erasable phase change memories. The phrase "substantially the same average local atomic density distribution" is thus to be interpreted to permit a reasonable range of atomic re-arrangement and resulting variation in local atomic density between the amorphous and crystalline states which still yields the performance advantages in accordance with the teachings of the present invention.

The terms "substantially amorphous" and "amorphous" as used herein mean a condition which is relatively atomically less ordered or more disordered and has as a result thereof detectably different electrical characteristics such as a lower electrical conductivity. The terms "substantially crystalline" and "crystalline" mean a condition which is relatively atomically more ordered and has as a result thereof a detectably different electrical characteristic such as a higher electrical conductivity.

It has been determined that, in one embodiment of the invention, the material forms a multi-element and multi-phase crystalline structure in the crystalline state and that the crystalline phases in this state have crystallization temperatures which are relatively close to each other. For example, in the phase change material having the composition $Te_{52}Ge_{24}Sb_{24}$ in the amorphous state, which crystallizes into two crystalline phases as described herein, it has been determined that one of these two phases crystallizes at 155° C. and the other crystallizes at 172° C. It is believed that this multi-phase crystalline structure with crystalline phases which form at temperatures close to each other is a preferred form of the crystalline structure of the material of the present invention because the material is believed to be more readily switchable from the crystalline state to the amorphous state and more stable also in the amorphous state.

If the material has only one crystalline phase (sometimes referred to herein as a "single crystalline phase"), but otherwise conforms to the criteria of the invention, it may be fully satisfactory for some applications but less optimum for other applications because it is so stable in the crystalline state that it may be more difficult to switch it back to the amorphous state and less stable in the amorphous state once switched back to that condition. However, such properties may be more adaptable to certain applications of the invention and may provide properties which are actually preferred for some applications. In any event, such single crystalline phase material will typically exhibit the greatly enhanced speed and low switching energy characteristics of the present invention.

In addition, since the one or more crystalline phases are stable and readily formed phases, the transition is reliably performed and two stable and truly non-volatile conditions are provided.

One of the important principle of the present invention is, however, that substantially all of the elements present in the amorphous state be substantially fully absorbed in the crystalline phase or phases when the material is switched to the crystalline state. This greatly minimizes atomic migration and allows switching between phases to take place rapidly and with low switching energy. It is also believed that, as noted above, in the case of multi-phase crystalline formations, the crystallization temperatures of the different crystalline phases should advantageously be close to each other to accommodate formation of the multiple phases in the same general temperature zone.

It is further believed that relatively small crystallite sizes in the crystalline phase or phases may further contribute to the rapid formation of the crystalline phase or phases and to the lower energy requirements for the transitions between amorphous and crystalline states.

In accordance with still another aspect of the present invention, we have found that the switching characteristics of such materials may be controlled such that optimum switching transitions can be effected. It has been found that, in order for the materials of the present invention to perform at the substantially enhanced levels which are attainable over the performance parameters of the prior art, exact compositional stoichiometry is not required since the material lattice will typically tolerate a certain level of extraneous atomic material without substantial degradation in the performance level of the material. The word "substantially" is therefore used herein to mean that level of conformance to the stoichiometric principles taught herein which enable the attainment of the improvements in performance parameters over prior art electrically erasable memories as provided by the present invention.

As noted above, it is also believed that the relatively small crystallite size range of the crystalline phases may contribute to the rapid transition between the crystalline and amorphous states. We have postulated that a crystalline structure which approaches a microcrystalline lattice in structure switches more rapidly between amorphous and crystalline states because the microstructures require less atomic adjustment to accommodate the transitions between the amorphous and crystalline structural states. At the same time, the multi-phase nature of the crystalline state further enhances and stabilizes the transition to the amorphous state.

One characteristic of the phase change materials of the present invention is that they appear to tend toward the formation of more and smaller crystallites per unit volume of the material. Crystallite sizes of representative materials embodying the present invention have been found to have small crystallite sizes in the range of from about 100 to 500 Angstroms and generally less than the range of about 1,000 to 5,000 Angstroms characteristic of prior art materials. Crystallite size as referred to herein is in general the diameter of the crystallites, or the "characteristic dimension" thereof equivalent to the diameter where the crystallites are not spherically shaped. Thus, the term "characteristic dimension" means the average distance across the crystallite, that is, either the diameter or the equivalent thereof.

It has been determined that the composition in the amorphous state of the class of TeGeSb materials which meet the criteria of the present invention appear to be generally characterized by substantially reduced concentrations in Te below those present in prior art materials used as electrically erasable phase change materials. In the compositions in this class which were found to provide the substantially improved electrical switching performance characteristics, the average concentrations of Te in the amorphous state were well below 70%, typically below about 60% and ranged in general from as low as about 23% up to about 56% Te. Concentrations of Ge were above about 15% and ranged from a low of about 17% to about 44% average in the amorphous state, remaining generally below 50% Ge, with the remainder of the principal constituent elements in this class being Sb. The percentages given are atomic percentages which total 100% of the atoms of the constituent elements. Thus, this class of materials may be characterized as $Te_aGe_bSb_{100-(a+b)}$, where a is equal to or less than about 70% and preferably equal to or less than about 60%, b is above about 15% and less than 50%, preferably between about 17% to about 44% and the remainder is Sb.

In the case of the TeGeSb class of materials, the following crystalline phases were found to be present either singly or in combination in various forms of the crystalline state for various approximate compositions falling within the above ranges of the amorphous state:

TABLE I

Observed Crystalline Phases of TeGeSb

| Name of Phase | At % Te | At % Ge | At % Sb |
| --- | --- | --- | --- |
| α | 51 | 44 | 5 |
| β | 51 | 40 | 9 |
| γ | 45 | 28 | 27 |
| δ | 23 | 19 | 58 |
| η | 56 | 17 | 27 |
| κ | 53 | 30 | 17 |

The average for these elements in the amorphous state was in one sample about 53% Te, 21% Ge and 26% Sb.

Figure 1:
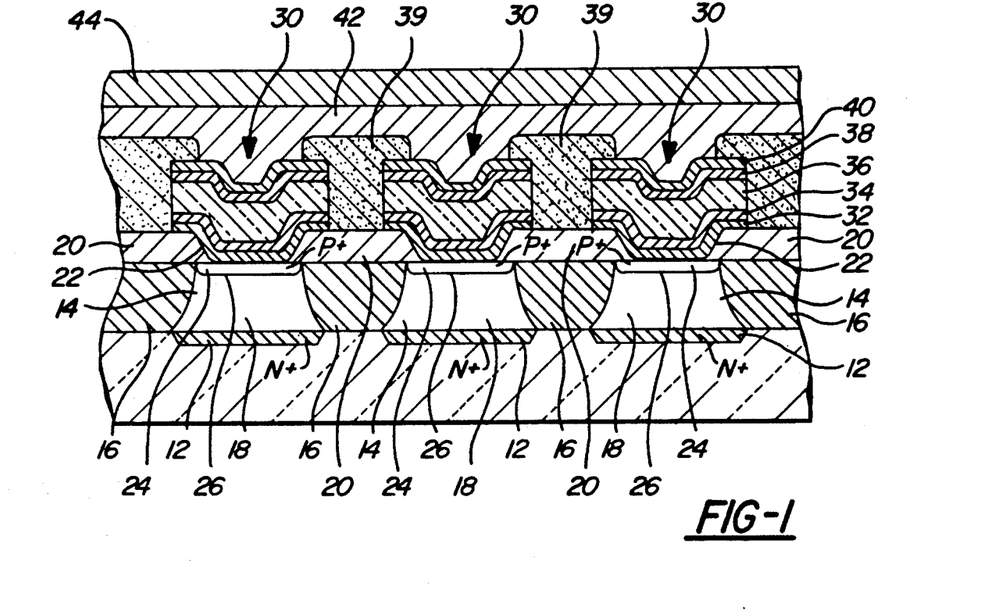
FIG. 1 is a fragmentary cross sectional view of a portion of an integrated circuit electrically erasable phase change memory configuration embodying the present invention.

Referring now to FIG. 1, there is shown a cross sectional view of a portion of the structure of an electrically erasable phase change memory embodying the present invention. The memory structure is formed on a single crystal silicon semiconductor wafer 10 which is p-doped and which forms a p-substrate for the deposition of the remaining elements of the configuration illustrated.

Formed in the p-substrate 10 are n+ channels 12, which may be formed by diffusion in a manner well known in the art. These n+ channels extend across the chip in a direction perpendicular to the plane of the illustration and form one set of electrodes, in this case the y set, of an x-y electrode grid for addressing the individual memory elements.

On top of this n+ grid structure is formed an n-doped crystalline epitaxial layer 14, again by techniques well known in the art. The n doped epitaxial layer 14 may be about 5,000 Angstroms thick, for example. Using known masking and doping techniques, p-doped isolation channels 16 are then formed in the n-epitaxial layer 14. These p-doped isolation channels 16 extend all the way down to the p substrate 10 as shown in FIG. 1 and also extend completely around and isolate and define islands 18 of the n-epitaxial layer 14. The islands 18 are shown more clearly in the top view of FIG. 2 wherein the p isolation channels are shown as forming an isolation grid defining and isolating the islands 18 of n epitaxial material. Instead of the p-doped isolation channels, $SiO_2$ isolation trenches may be used for isolation of the islands 18. The technique of formation of such $SiO_2$ isolation trenches is well known to those skilled in the art.

A layer 20 of thermally grown $SiO_2$ is then formed on the structure just described and etched out to form apertures 22 over the islands 18. Diffusion regions 24 of p+ material are then formed within the areas defined by the apertures 22 as shown in FIG. 1. The semiconductor junctions of the p+ regions and the n epitaxial layer form p-n junction diodes 26 in series with each of the regions of the n epitaxial layer exposed through the apertures 22 of the $SiO_2$ layer 20.

The memory elements 30 are then deposited over the p+ regions 24 in individual ohmic electrical series contact with the diodes 26. The memory elements 30 are comprised of bottom thin electrical contact layers of molybdenum 32 and carbon 34, the memory layer 36 formed of a material as described above, and upper thin electrical contact layers 38 of carbon and 40 of molybdenum. The contact layers 32, 34, 38 and 40 of carbon and molybdenum form excellent electrical contacts with the memory layers 36 and also form diffusion barriers which effectively block diffusion of elements into and out of the memory layers 36.

The carbon layers 34 and 38 have a relatively high electrical resistivity and are more difficult to etch and are therefore preferably relatively thin, typically in the range of 100 to 1,000 Angstroms or so. The molybdenum layers 32 and 40 should be thicker, say in the range of 1,000 to 2,000 Angstroms or so in order to act as effective diffusion barriers for the memory layers 36.

The memory layer 36 is formed of a multi-element phase change material as disclosed herein. The layer 36 is preferably sputter deposited in the substantially amorphous state, but may be formed in other ways such as by evaporation or by chemical vapor deposition, which may be enhanced by plasma techniques such as RF glow discharge. The memory layer 36 may typically range in thickness from about 200 Angstroms to about 5,000 Angstroms and is preferably about 200 to 1,000 Angstroms in thickness. The lateral dimension or diameter of the pore of phase change material 36 may be in the range of about one micrometer or so, although there is no practical limit on the lateral dimension. It has been determined that the diameter of the actual conductive path of crystalline material formed in the "set" condition is as small as one-fourth to one-third of a micrometer. The pore diameter can thus be as small as lithography resolution limits will permit.

In a preferred embodiment of the present invention, the pore diameter is selected such that it conforms substantially with the diameter of the crystallized low resistance path which is formed when the material is switched to the crystalline state. As noted above, the actual diameter of the crystallized low resistance path has been determined to be in the range of about one-fourth to about one-third or more of a micrometer. The diameter of the pore of memory material 36 is therefore preferably less than about one micrometer so that the volume of the memory material 36 is limited as much as is feasible to the volume of the phase change material 36 which is actually switched back and forth between the crystalline and amorphous states. This further reduces the switching time and the electrical energy required to initiate the phase change. The pore diameter as used herein means the cross sectional lateral dimension of the memory layer 36 which extends under the contact regions formed with the memory layer 36 and with the lower p+ layer and the upper conductors 42 as shown in the embodiment of FIG. 1 and, in the case of the embodiment of FIG. 2, with the lower metal layer 29 of the Schottky diode.

It is further preferred that the pore regions of the memory elements 30 be thermally isolated and/or controlled except only for the required electrical contacts with the upper and lower contacts as necessary for proper operation of the memory elements. This further confines, limits and controls the heat transfer from the switched volume of the pore and the electrical energy required for the phase transitions. This is accomplished in the embodiments of FIGS. 1 and 2 by the oxide layers 20 and 39 which surround the lateral peripheral portions of the memory elements 30.

As used herein, the "set" condition refers to the low resistance substantially crystalline state and the "reset" condition refers to the high resistance or substantially amorphous state.

The layers 32, 34, 36, 38 and 40 are etched and an oxide layer 39 is formed thereover and etched to leave openings above the memory elements 30 as shown. Alternatively, the memory elements may be formed in a two step etch process with layers 32 and 34 being first deposited and etched and then remaining layers 36, 38 and 40 being deposited thereover and separately etched to the selected dimension. Deposited on top of the entire structure just described is the second electrode grid structure formed of aluminum conductors 42, which extend perpendicular in direction to the conductors 12 and complete the x-y grid connection to the individual memory elements. Overlaying the complete integrated structure is a top encapsulating layer 44 of a suitable encapsulant such as $Si_3N_4$ or a plastic material such as polyimide, which seals the structure against moisture and other external elements which could cause deterioration and degradation of performance, particularly of the phase change materials in the memory layer 36. The $Si_3N_4$ encapsulant can be deposited, for example, using a low temperature plasma deposition process. The polymide material can be spin deposited and baked after deposition in accordance with known techniques to form the encapsulant layer 44.

Figure 2:
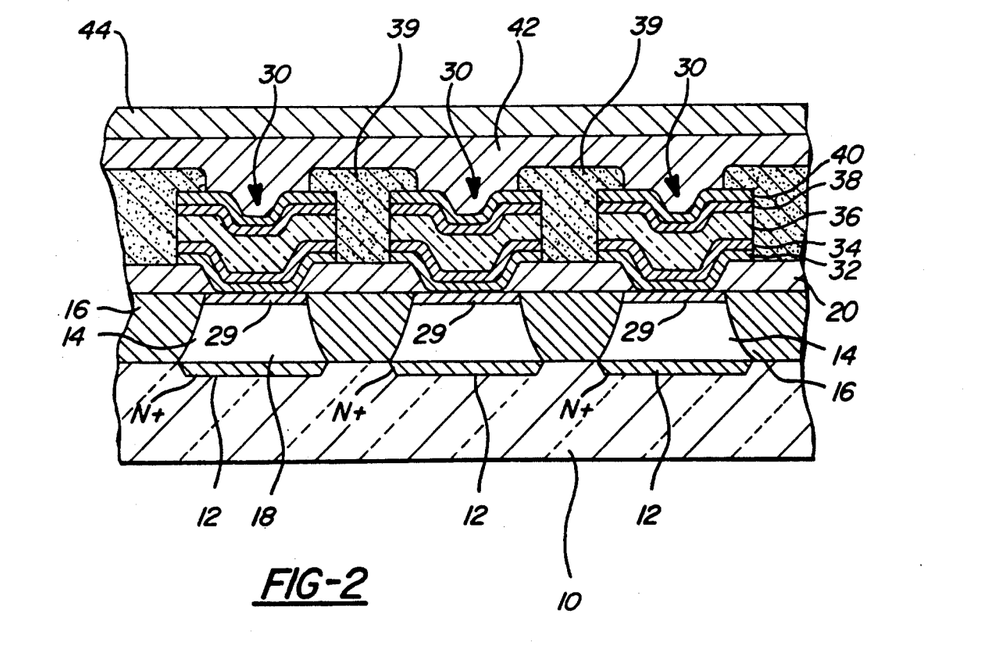
FIG. 2 is a fragmentary cross sectional view of a portion of an integrated circuit electrically erasable phase change memory configuration illustrating another embodiment of the present invention.

The embodiment of FIG. 2 is the same as FIG. 1 except that a diode 27 is formed of a Schottky barrier between the n layer 14 and a metal layer 29 which may be, for example, platinum silicide. In other respects, the embodiment of FIG. 2 is formed in the same manner as that of FIG. 1 and like elements are labeled with like numerals.

Figure 3:
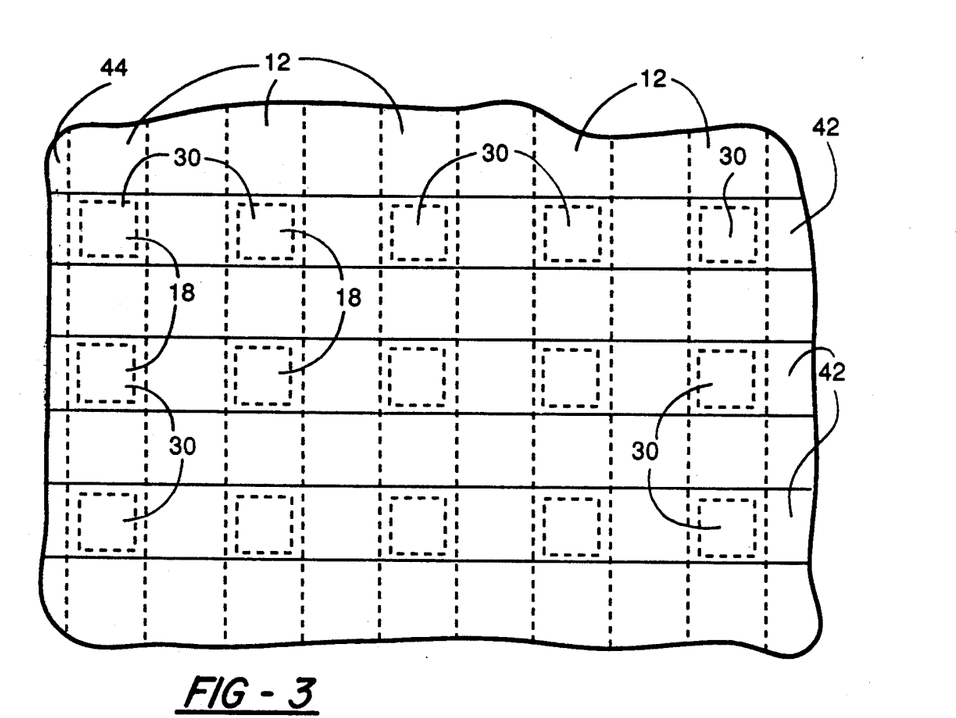
FIG. 3 is a top plan view of a portion of the integrated circuit configurations of FIGS. 1 and 2.

The integrated structure thus formed is an x-y memory matrix connected as shown in FIG. 3 in which each memory element 30 is connected in series with a diode 26 between a horizontal x-line 42 and a vertical y-line 12. The diodes 26 serve to isolate electrically each of the memory elements 30. Other circuit configurations for the electrically erasable memory of the present invention are, of course, possible and feasible to implement.

With the integrated structure as shown in the embodiment of FIGS. 1 and 2, however, a completely vertically integrated structure of the memory element and its isolating diode is formed, thus minimizing the area occupied on the substrate by each of the combinations of memory elements and diodes. This means that the density of the memory elements in the chip is limited essentially only by the resolution of the lithography.

Figure 4:
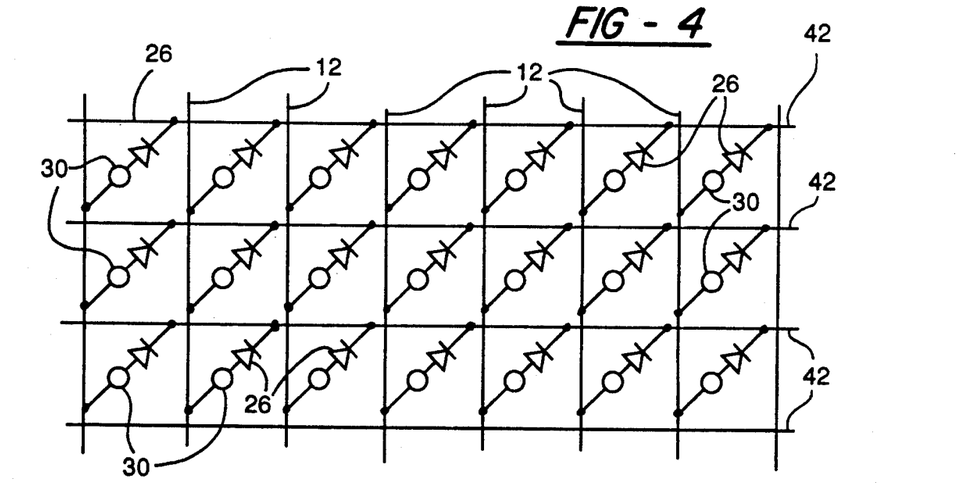
FIG. 4 is a partial circuit diagram of a portion of the circuitry of the integrated circuit configurations of FIGS. 1 and 2.
Figure 4A:
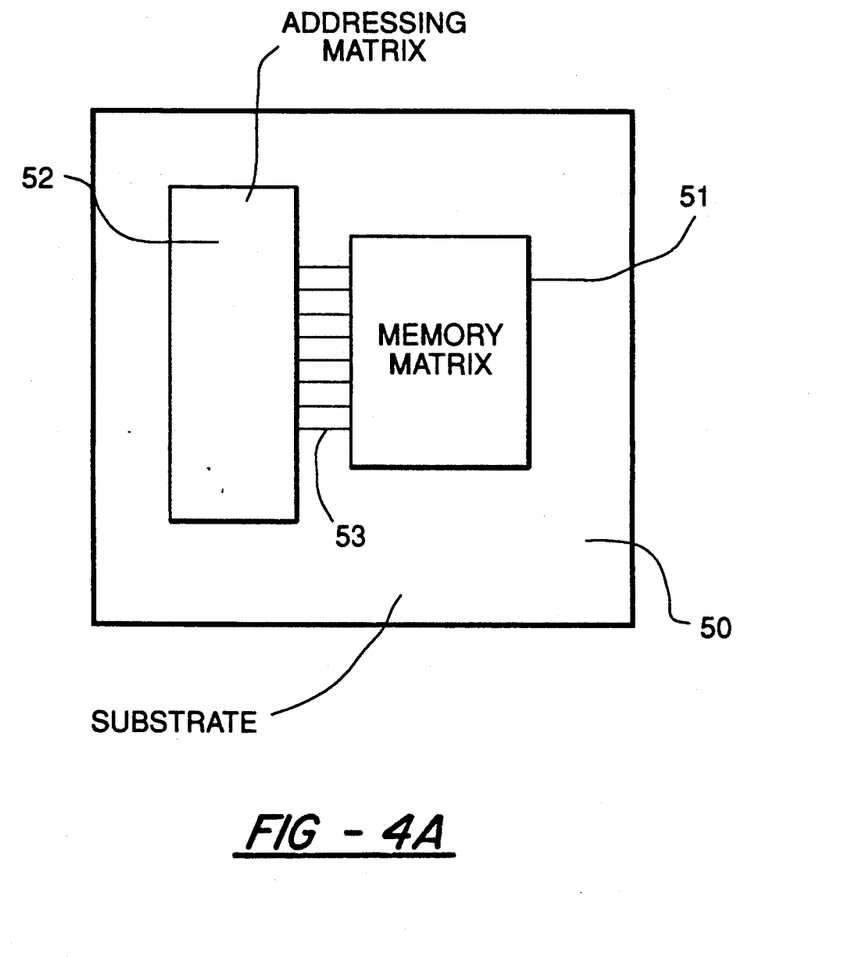
FIG. 4A is a diagrammatical illustration of a portion of a single crystal semiconductor substrate with integrated memory and addressing matrixes embodying the present invention.

In FIG. 4A, there is diagrammatically illustrated a portion of a single crystal semiconductor substrate 50 with a memory matrix 51 embodying the present invention formed thereon. Also formed on the same substrate 50 is an addressing matrix 52 which is suitably connected through integrated connections 53 to the memory matrix 51. The addressing matrix 52 includes signal generating means which define and control the set, reset and read pulses applied to the memory matrix 51. The addressing matrix 52 may be integrated with and formed simultaneously with the memory matrix 51.

In prior art semiconductor memories having the high switching speeds and low switching energies deemed necessary for most applications of such memories, at least one transistor is required along with a capacitor for each memory element. The formation of such memories in integrated circuit form requires at least three connections along with other additional complexities which occupy a certain minimum substrate area regardless of how the integrated circuit is laid out. The integrated circuit configuration of the electrically erasable memory of the present invention requires only two connections to each memory element and these are made in vertical relationship to each other. Further, each memory element, complete with isolating diode and the pair of contacts for the element, is itself fully vertically integrated such that a much higher bit density is attained over that possible with prior art integrated circuits performing the same or similar functions.

In fact, the memory of the present invention allows a bit density which is greater than that attainable even in solid state dynamic random access memories (DRAM's), which are volatile and therefore lack the further advantages that non-volatility attainable with the present invention provides. The increase in bit density attainable with the present invention is translated into a corresponding reduction in manufacturing costs because of the smaller areas of the wafer occupied per bit of the integrated circuit configuration. This allows the memory of the present invention to compete with and surpass other available memories for a wider range of applications, not only in terms of performance but also in terms of cost.

By comparison with prior art semiconductor memories formed of at least one transistor and a capacitor for each bit, the integrated circuit configuration of the present invention as shown in FIGS. 1 and 2 can be formed on a chip with approximately three times the bit density as such prior art configurations for the same lithography resolution. In addition to the cost advantages which the higher bit density affords, the performance parameters of the memory in the integrated circuit configuration of the present invention are thus even further improved in that the elements are positioned closer together and lead lengths, capacitances and other related parameters are thus further minimized, thereby further enhancing performance.

FIG. 4 is a circuit diagram of a portion of the embodiments of FIGS. 1-3. The circuit comprises an x-y grid with each of the memory elements 30 being connected in series with a diode 26 at the cross points of the x address lines 42 and the y address lines 12 as shown. The address lines 12 and 42 are connected to external addressing circuitry in a manner well known to those skilled in the art.

Figure 5:
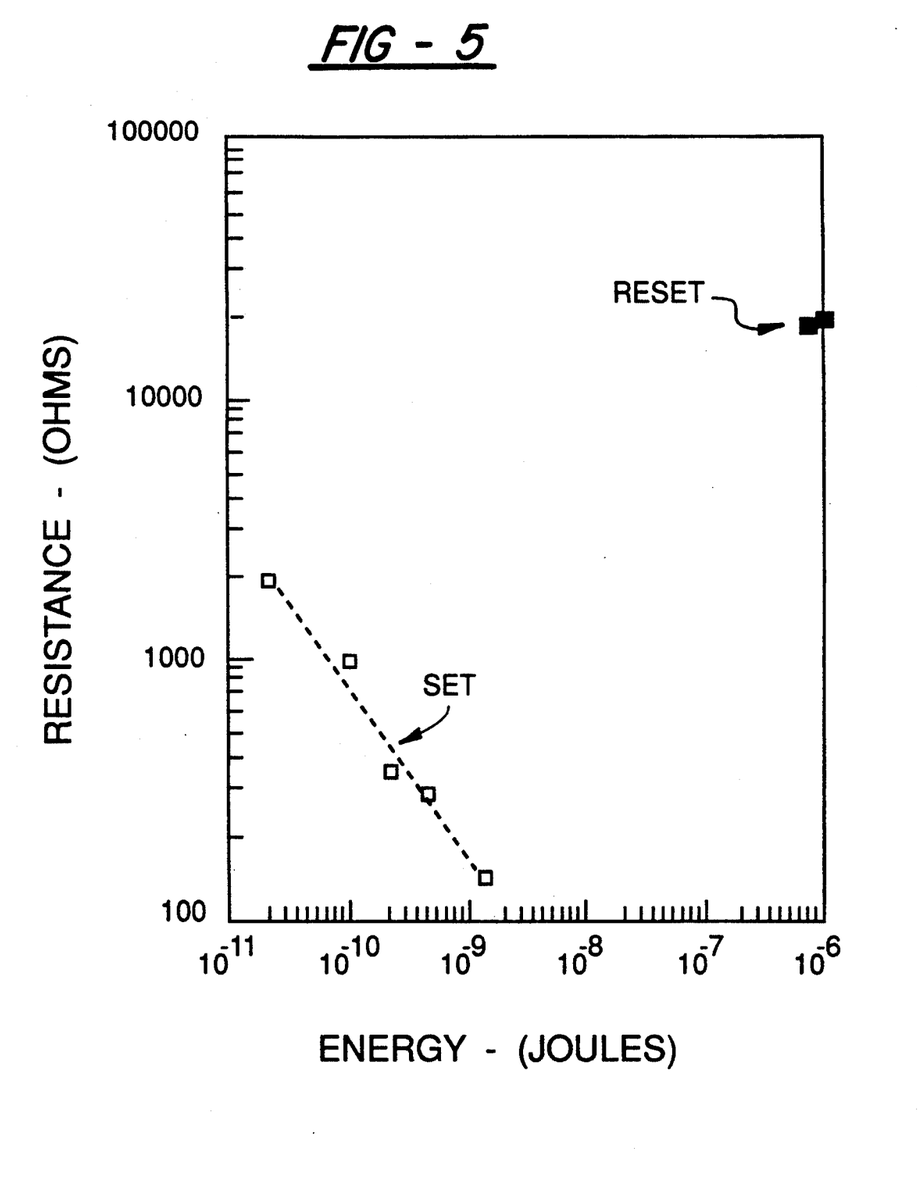
FIG. 5 is a graphical presentation of data taken on samples of electrically erasable phase change materials embodying the present invention and showing resistance in the crystalline state after switching from the amorphous state in relation to switching energy.

FIG. 5 is a graphical presentation of performance data taken from samples of memory elements embodying the present invention. The data are presented to show electrical resistance in the "set" or crystalline state and the switching energy in Joules required to switch the material in each case from the amorphous state, as initially deposited, to the crystalline state. The high resistance of the amorphous reset state is shown in the upper right hand corner of the graph of FIG. 5 and is just under 20,000 ohms as contrasted to a set resistance of about 150 ohms for a set energy of about $10^{-9}$ Joules. Switching times were typically in the range of 10 to 80 nanoseconds and the switching set energy typically in the range of about $10^{-9}$ Joules. Reset energy was about $10^{-6}$ Joules. These data are to be compared with the performance data of the prior art electrically erasable phase change memories which were in the range of microseconds to milliseconds typical switching times at switching energies in the range of $10^{-3}$ to $10^{-6}$ Joules. Thus, the performance parameters of the electrically erasable memory materials of the present invention are a number of orders of magnitude better than those attainable with prior art electrically erasable phase change memory materials.

In addition, it is to be noted with reference to FIG. 5 that the "set" resistance varies in a substantially linear fashion with the level of the energy of the set pulse, being about 150 ohms for a set pulse of about $10^{-9}$ Joules and about 2,000 ohms for a set pulse of about $10^{-11}$ Joules, with a fairly linear characteristic in between these points. This provides a gray scale characteristic which allows the memory elements of the present invention to behave in an adaptive memory response relationship, thereby allowing application to adaptive memory systems.

Figure 6:
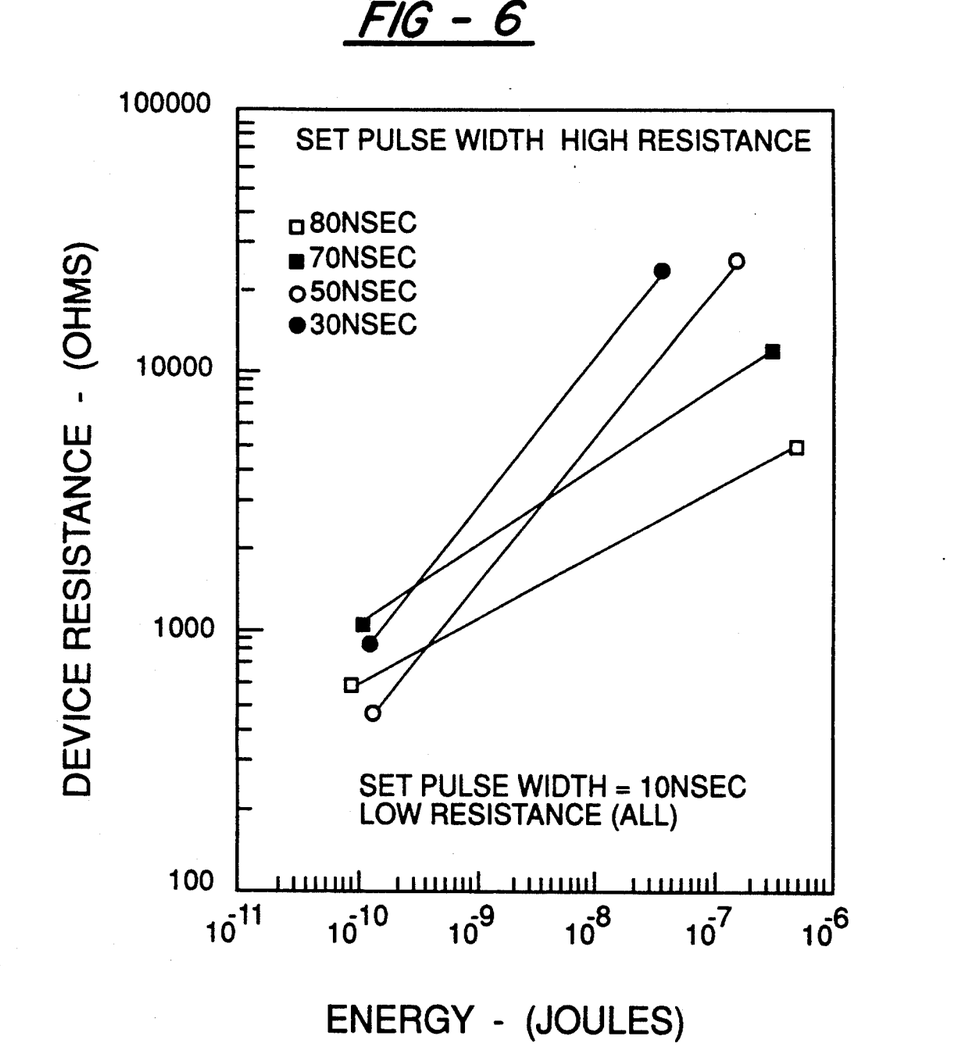
FIG. 6 is a graphical presentation of data on device resistance in relation to switching energy for different pulse widths.

FIG. 6 is a graphical presentation of data on electrical switching characteristics taken on samples of memory elements manufactured in accordance with and embodying the present invention. Device resistance in ohms is shown in relation to switching energy in Joules for reset pulse widths ranging from 30 to 80 nanoseconds. The reset to set resistance ratios are all separated by almost a full order of magnitude or more and are thus fully adequate to assure error free electrical detection between the set and reset conditions for digital memory applications. The reset energy at 30 nanoseconds is less than $10^{-7}$ Joules.

Figure 7:
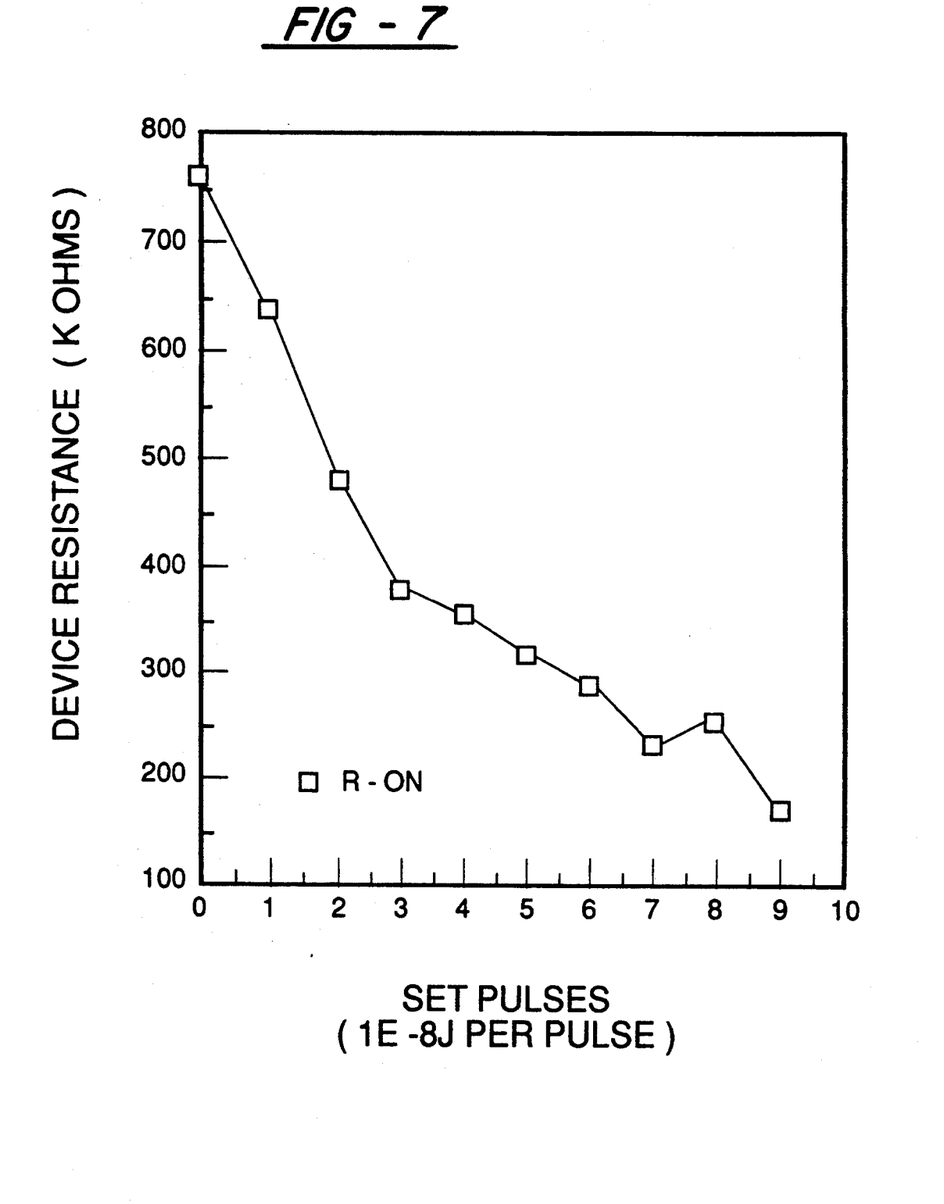
FIG. 7 is a graphical presentation of data relating to device "on" resistance as a function of the number of set pulses sequentially applied to the device and illustrating gray scale capability.

FIG. 7 is a graphical presentation of data depicting the set resistance of the device in kilohms in relation to the number of set pulses sequentially applied to the device. It is to be noted that the set resistance decreases as a function of the number of set pulses, thereby providing a gray scale or adaptive memory capability. For the data shown in FIG. 7, set pulses of about 50 nanoseconds at about 5 volts and about 40 milliamps were applied and the resistance was measured after each pulse before the next pulse in the sequence was applied. The data show that the set resistance can be driven down in increments by the sequential application of set pulses, thereby allowing the material to be set at different levels over the spectrum between completely amorphous and completely crystalline states.

Figure 8:
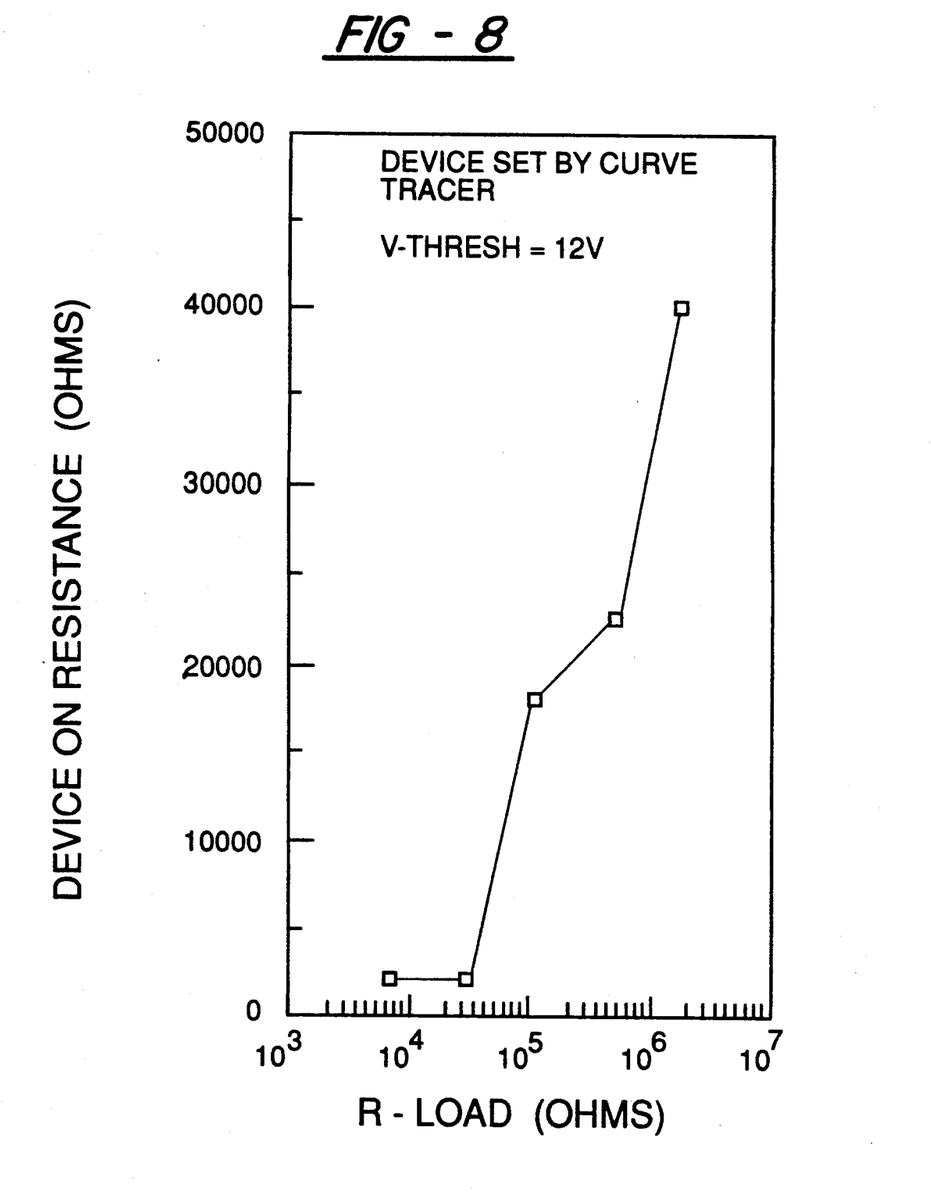
FIG. 8 is a graphical presentation of data relating to device "on" resistance as a function of load resistance which controls current flow after firing of the device.

FIG. 8 shows data taken on the device "on" resistance in ohms in relation to load resistance in ohms. The load resistance is connected in series with the device and hence serves to determine the magnitude of the current flow upon firing. The data were taken using a threshold voltage of 12 volts. The "on" resistance of the device decreases rapidly as a function of increasing set current down to a level of 100 ohms or so.

It will be seen from the foregoing that the electrically erasable phase change memory of the present invention provides remarkable improvements in performance over that attainable with prior art electrically erasable phase change memories which permit the widespread application of such memories beyond that possible with such prior art memories. It is to be understood that the disclosure set forth herein is presented in the form of the detailed embodiments described for the purpose of making a full and complete disclosure of the present invention, and that such details are not to be interpreted as limiting in any way the true scope of this invention as set forth and defined in the appended claims.

We claim:

1. An electrically erasable phase change memory comprising:
    (a) at least one pore of phase change material which is capable of being reversibly electrically switched between at least two electrically detectable states, the first of said at least two detectable stages having a local atomic order which is detectably less ordered than the local atomic order of the second of said at least two detectable states;
    (b) electrical contact means making electrical contact with at least two portions of said pore to establish an electrical path through said pore between the points of contact with said at least two portions; and
    (c) means for applying electrical signals to said electrical contact means to cause reversible switching of at least a volume portion of said phase change material in said electrical path in said pore between said at least two detectable states, said first detectable state being characterized by an electrical conductivity which is lower than that of said second detectable state;
    (d) said phase change material being comprised of a plurality of elements which are distributed within said phase change material in said first detectable state and are converted into said second detectable state in said volume portion with substantially the same average local density of distribution of the constituent elements within said volume portion as present in said first detectable state.

2. An electrically erasable phase change memory as set forth in claim 1 in which said plurality of elements distributed within said phase change material in said first detectable state are substantially fully absorbed in one or more crystalline phases in said volume portion of second detectable state.

3. An electrically erasable phase change memory as set forth in claim 1 wherein said phase change material comprises Te, Ge and Sb as the principal elements thereof, which are distributed in the amorphous state substantially in the ratio $Te_aGe_bSb_{100-(a+b)}$, where the subscripts are in atomic percentages which total 100% of the constituent elements and a is equal to or less than about 70% and b is between about 15% to about 50%.

4. An electrically erasable phase change memory as set forth in claim 3 where a is equal to or less than about 60% and b is between about 17% to about 44%.

5. An electrically erasable phase change memory as set forth in claim 1 in which the band gap of said phase change material is substantially reduced in the transition from said first detectable state to said second detectable state.

6. An electrically erasable phase change memory as set forth in claim 2 in which said one or more crystalline phases includes at least one multi-element crystalline phase.

7. An electrically erasable phase change memory as set forth in claim 2 in which said one or more crystalline phases includes a plurality of multi-element crystalline phases.

8. An electrically erasable phase change memory as set forth in claim 2 in which said one or more crystalline phases comprises a plurality of crystalline phases.

9. An electrically erasable phase change memory as set forth in claim 8 in which the crystallization temperatures of said plurality of crystalline phases are all within about 100° C. of each other.

10. An electrically erasable phase change memory as set forth in claim 2 in which the crystallites in said multi-element crystalline phases have a characteristic dimension of less than about 1,000 Angstroms.

11. An integrated circuit electrically erasable phase change memory comprising:
    (a) a single crystal semiconductor substrate;

(b) a plurality of electrically erasable phase change memory elements formed on said substrate;

(c) each of said memory elements comprising a pore of phase change material and an integrated circuit means for electrically isolating said memory element, said electrical isolating means and said pore of phase change material being electrically connected in series with each other;

(d) said phase change material being comprised of a plurality of elements which are distributed within said phase change material in a first substantially amorphous state and are converted into a second substantially crystalline state in at least a volume portion of said pore with substantially the same average local density of distribution of the constituent elements within said volume portion as present in said substantially amorphous state; and (e) integrated electrical contact means extending across said substrate over the upper and lower portions respectively of said memory elements and making electrical contact on one side of each of said memory elements with said pore of phase change material and on the other side of each of said memory elements with said electrical isolating means and thereby providing means for selectively and individually electrically setting, erasing and reading said memory elements.

12. An integrated circuit electrically erasable phase change memory as set forth in claim 11 further comprising signal generating means electrically connected to said contact means for generating and applying selectively to said memory elements set, erase and read pulses.

13. An integrated circuit electrically erasable phase change memory as set forth in claim 12 in which said signal generating means includes means for generating and applying set pulses of less than 100 nanoseconds in width.

14. An integrated circuit electrically erasable phase change memory as set forth in claim 11 in which said diode comprises a semiconductor junction.

15. An integrated circuit electrically erasable phase change memory as set forth in claim 14 wherein said semiconductor junction is formed at a surface extending substantially parallel to the surface of said substrate.

16. An integrated circuit electrically erasable phase change memory as set forth in claim 14 in which said semiconductor junction comprises a Schottky barrier.

17. An integrated circuit electrically erasable phase change memory as set forth in claim 14 in which said semiconductor junction comprises a p-n junction.

18. An integrated circuit electrically erasable phase change memory as set forth in claim 17 in which said p-n junction is formed at a surface extending substantially parallel to the surface of said substrate.

19. An integrated circuit electrically erasable phase change memory as set forth in claim 16 in which said Schottky barrier is formed at a surface extending substantially parallel to the surface of said substrate.

20. An integrated circuit electrically erasable phase change memory as set forth in claim 15 in which said one side and said other side of each of said memory elements which make electrical contact with said integrated electrical contact means are positioned in vertical relationship to each other.

21. An integrated circuit electrically erasable phase change memory as set forth in claim 20 in which said one side and said other side of each of said memory elements which make electrical contact with said integrated electrical contact means include contact surfaces which extend substantially parallel to each other and to the surface of said substrate.

22. An integrated circuit electrically erasable phase change memory as set forth in claim 11 in which said phase change material comprises Te, Ge and Sb as the principal elements thereof, which are distributed in the amorphous state substantially in the ratio $Te_aGe_bSb_{100-(a+b)}$, where the subscripts are in atomic percentages which total 100% of the constituent elements and a is equal to or less than about 70% and b is between about 15% to about 50%.

23. An integrated circuit electrically erasable phase change memory as set forth in claim 22 where a is equal to or less than about 60% and b is between about 17% to about 44%.

24. An integrated circuit electrically erasable phase change memory as set forth in claim 11 further comprising a layer of encapsulating material extending over and encapsulating and sealing said memory elements against external environmental influences.

25. An integrated circuit electrically erasable phase change memory as set forth in claim 11 in which said pore of phase change material is less than one micrometer in diameter.

26. An electrically erasable phase change memory as set forth in claim 1 in which the diameter of said pore is less than one micrometer.

27. An electrically erasable phase change memory as set forth in claim 2 in which the diameter of said pore is less than one micrometer.

28. An integrated circuit electrically erasable phase change memory as set forth in claim 11 in which said electrical isolating means comprises a diode positioned vertically with respect to said pore of phase change material.

* * * * *

UNITED STATES PATENT AND TRADEMARK OFFICE
CERTIFICATE OF CORRECTION

PATENT NO. : 5,166,758
DATED : November 24, 1992
INVENTOR(S) : Ovshinsky, et. al.

It is certified that error appears in the above-indentified patent and that said Letters Patent is hereby corrected as shown below:

Column 13, line 68, delete stages and insert--"states".

Signed and Sealed this

Thirteenth Day of December, 1994

Attest:

BRUCE LEHMAN

Attesting Officer

Commissioner of Patents and Trademarks